United States Patent
Bikulcius

(10) Patent No.: US 6,515,523 B1
(45) Date of Patent: Feb. 4, 2003

(54) METHOD AND APPARATUS FOR GENERATING A POWER-ON RESET WITH AN ADJUSTABLE FALLING EDGE FOR POWER MANAGEMENT

(75) Inventor: Simon Bikulcius, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/864,662

(22) Filed: May 23, 2001

(51) Int. Cl.[7] .................................................. H03L 7/00
(52) U.S. Cl. ........................ 327/142; 327/143; 327/198
(58) Field of Search ................................. 327/142, 143, 327/198, 427, 437

(56) References Cited

U.S. PATENT DOCUMENTS

| | | | |
|---|---|---|---|
| 5,523,709 A | 6/1996 | Phillips et al. ............... | 327/143 |
| 5,528,184 A | 6/1996 | Gola et al. ................... | 327/198 |
| 5,760,624 A | 6/1998 | McClintock ................. | 327/143 |
| 5,821,787 A | 10/1998 | McClintock et al. ........ | 327/143 |
| 5,847,586 A | 12/1998 | Burstein et al. ............. | 327/143 |
| 5,883,532 A | 3/1999 | Bowers ........................ | 327/143 |
| 6,118,315 A * | 9/2000 | Guedj .......................... | 327/143 |
| 6,184,724 B1 * | 2/2001 | Lin ............................... | 327/80 |
| 6,333,654 B1 * | 12/2001 | Harris et al. ................. | 327/170 |

* cited by examiner

Primary Examiner—Tuan T. Lam
Assistant Examiner—Hiep Nguyen
(74) Attorney, Agent, or Firm—Merchant & Gould P.C.; Joshua W. Korver

(57) ABSTRACT

A method and apparatus is directed to a power-on reset circuit for providing a power-on reset signal having a rising edge and an adjustable falling edge. A reference generator circuit produces two different reference signals in response to a power supply signal. The two reference signals are compared by a comparison circuit to produce a resulting reference signal. The resulting reference signal tracks the power supply signal until a first threshold potential is reached. When the first threshold potential is reached, a rising edge is produced in the power-on reset signal. The rising edge indicates that the power supply signal has reached an operating potential. A second threshold potential corresponds to the adjustable falling edge of the power-on reset signal. When the power supply signal decreases below the second threshold potential, the adjustable falling edge is produced in the power-on reset signal. The second threshold potential is adjusted when an adjustment circuit selectively couples additional transistors to the reference generator circuit. The additional transistors change the level of the second threshold potential in relation to the power supply signal. Adjusting the second threshold potential adjusts the falling edge of the power-on reset signal. The falling edge may operate as a low voltage detector by indicating that the power supply signal has decreased below its operating potential.

24 Claims, 5 Drawing Sheets

METHOD AND APPARATUS FOR GENERATING A POWER-ON RESET WITH AN ADJUSTABLE FALLING EDGE FOR POWER MANAGEMENT

FIELD OF THE INVENTION

The present invention relates to the field of circuits, and in particular, to a method and apparatus for a power-on reset circuit with improved power management.

BACKGROUND OF THE INVENTION

Digital circuits often use a power-on reset (POR) signal for resetting the digital circuitry during power-up. As the power supply signal approaches a stable operating potential, the POR signal is used to reset, or initialize, the digital circuitry. During operation, the digital circuit may suddenly lose the power supply signal, or the power supply signal may destabilize. The POR signal is used again to reset the digital circuitry until the power supply signal again reaches the stable operating potential. The digital circuitry often reset by a POR signal, includes circuits such as the CMOS logic gates, memory, flip-flops, and timing signal generators. Analog circuits may also use a POR signal to disable certain circuits until a stable power supply signal is available. Using a POR signal ensures proper operation of the analog circuit.

A low voltage detector may be used to detect when the power supply signal decreases below a predetermined potential. The predetermined potential is often chosen according to the minimum operating potential of the circuit. The POR circuit may be used in conjunction with the low voltage detector to reset the circuit at appropriate times.

SUMMARY OF THE INVENTION

In accordance with the invention, a power-on reset circuit provides a power-on reset signal that includes a rising and falling edge. The rising and falling edges of the power-on reset signal have associated rising edge and falling edge trip points. The rising edge trip point can be used to reset internal components of a logic circuit. The falling edge trip point can be used as a low voltage detection signal, indicating when a power supply has decreased below a predetermined potential. The falling edge trip point is adjustable in relation to the potential of the power supply to improve the power management.

Briefly stated, a method and apparatus is directed to a power-on reset circuit for providing a power-on reset signal having a rising edge and an adjustable falling edge. A reference generator circuit produces two different reference signals in response to a power supply signal. The two reference signals are compared by a comparison circuit to produce a resulting reference signal. The resulting reference signal tracks the power supply signal until a first threshold potential is reached. When the first threshold potential is reached, a rising edge is produced in the power-on reset signal. The rising edge indicates that the power supply signal has reached an operating potential. A second threshold potential corresponds to the adjustable falling edge of the power-on reset signal. When the power supply signal decreases below the second threshold potential, the adjustable falling edge is produced in the power-on reset signal. The second threshold potential is adjusted when an adjustment circuit selectively couples additional transistors to the reference generator circuit. The additional transistors change the level of the second threshold potential in relation to the power supply signal. Adjusting the second threshold potential adjusts the falling edge of the power-on reset signal. The falling edge may operate as a low voltage detector by indicating that the power supply signal has decreased below its operating potential.

An embodiment of the invention is directed to an apparatus, generating a power-on reset signal, wherein the power-on reset signal has a rising edge and an adjustable falling edge, that includes a reference generator circuit. The reference generator circuit is arranged to produce a first reference signal and a second reference signal in response a power supply signal. A comparison circuit is arranged to produce a resulting reference signal in response to a comparison between the first reference signal and the second reference signal. The resulting reference signal depends upon a first threshold potential and a second threshold potential of the power supply signal. A detector circuit is arranged to produce the power-on reset signal in response to the resulting reference signal. The rising edge occurs in the power-on reset signal when the power supply signal increases above the first threshold potential and the adjustable falling edge occurs when the power supply signal decreases below the second threshold potential. An adjustment circuit is arranged to adjust the adjustable falling edge of the power-on reset signal in response to the resulting reference signal. The adjustable falling edge is adjusted by changing the second threshold potential.

Another embodiment of the invention is directed to a method for producing a power-on reset signal with improved power management. The method includes: generating a first reference signal that relates to a power supply signal, generating a second reference signal that relates to the power supply signal, comparing the first reference signal to the second reference signal, producing a resulting reference signal with an associated potential at a node in response to the comparison of the first reference signal to the second reference signal, detecting the associated potential of the resulting reference signal, triggering a first edge in the power-on reset signal in response to the associated potential of the resulting reference signal when the power supply signal crosses a first threshold potential, triggering the second edge in the power-on reset signal in response to the associated potential of the resulting reference signal when the power supply signal crosses a second threshold potential that is different from the first threshold potential, and adjusting the second edge in the power-on reset signal by adjusting the second threshold potential.

Yet another embodiment of the invention is directed to an apparatus, providing a power-on reset signal with an adjustable second edge. The apparatus includes a means for generating a first reference signal that is arranged to generate a first reference signal that relates to a power supply signal. A means for generating a second reference signal is arranged to generate a second reference signal that relates to the power supply signal. A means for producing a resulting reference signal is arranged to produce a resulting reference signal with an associated potential in response to the first reference signal and the second reference signal. A means for detecting is arranged to detect the associated potential of the resulting reference signal. A means for triggering a first edge is arranged to trigger a first edge in the power-on reset signal in response to the associated potential of the resulting reference signal when the power supply signal crosses a first threshold potential. A means for triggering the second edge is arranged to trigger a second edge in the power-on reset signal in response to the associated potential of the resulting reference signal when the power supply signal crosses a second threshold potential, wherein the second threshold potential is different from the first threshold potential. A means for adjusting is arranged to adjust the second edge in the power-on reset signal by adjusting the second threshold potential.

A more complete appreciation of the present invention and its improvements can be obtained by reference to the accompanying drawings, which are briefly summarized below, to the following detail description of presently preferred embodiments of the invention, and to the appended claims.

DETAILED DESCRIPTION OF THE PREFERRED EMBODIMENT

Figure 1:
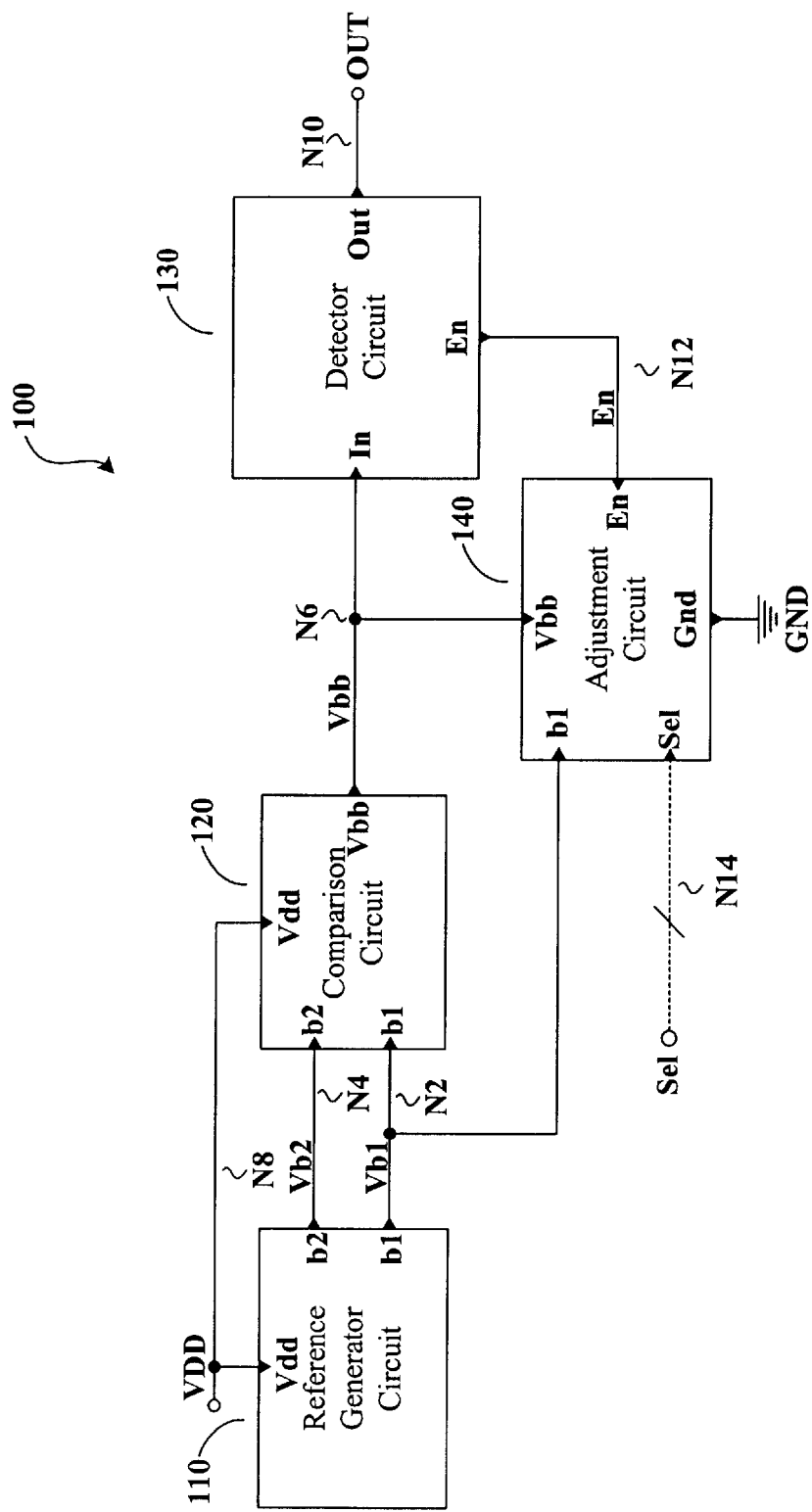
FIG. 1 illustrates a schematic diagram of an electronic circuit operating as a power-on reset circuit with improved power management.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal.

The present invention relates to power-on reset (POR) circuits that provide an adjustable falling edge on a power-on reset signal such that the POR has improved power management. Two reference signals are produced having different potentials with respect to a power supply signal. The two reference signals are compared to one another to produce a resulting reference signal. The resulting reference signal initially tracks the increasing power supply signal until a first threshold potential is reached. When the power supply signal exceeds the first threshold potential, the resulting reference signal decreases toward a ground potential. The decrease in the resulting reference signal produces a rising edge in the power-on reset signal. The rising edge of the power-on reset signal may be used to reset a subsequent circuit. By using the rising edge of the power-on reset signal to reset the subsequent circuit, the subsequent circuit is prepared for operation when the power supply signal reaches a stable operating potential.

A second threshold potential is arranged to detect a decreasing power supply signal. The second threshold potential is used to trigger a falling edge in the power-on reset signal when the power supply signal decreases below the second threshold potential. Thus, the falling edge of the power-on reset signal operates as a low voltage detection signal, indicating that the power supply has decreased below a level at which a subsequent circuit can operate. The falling edge of the power-on reset signal in the present invention, is adjustable by adjusting a level of the second threshold potential. An adjustment circuit is used to increase or decrease the level of the second threshold potential.

FIG. 1 illustrates a schematic diagram of an electronic circuit (100) for producing a power-on reset signal in accordance with one embodiment of the present invention. The electronic circuit (100) includes a reference generator circuit (110), a comparison circuit (120), a detector circuit (130), and an adjustment circuit (140).

The reference generator circuit (110) includes a first output port (b1) that is coupled to node N2, a second output port (b2) that is coupled to node N4, and an input port (Vdd) that is coupled to node N8. The comparison circuit (120) includes a first input port (b1) that is coupled to node N2, a second input port (b2) that is coupled to node N4, a third input port (Vdd) that is coupled to node N8, and an output port (Vbb) that is coupled to node N6. The detector circuit (130) includes an input port (In) that is coupled to node N6, a first output port (Out) that is coupled to node N10, and a second output port (En) that is coupled to node N12. The adjustment circuit (140) includes a first input port (En) that is coupled to node N12, a second input port (Vbb) that is coupled to node N6, a third input port (Sel) that is optionally coupled to node N14, a fifth input port (b1) that is coupled to node N2, and an output port (gnd) that is coupled to ground (GND).

The reference generator circuit (110) produces a first reference signal (Vb1) and a second reference signal (Vb2) in response to a power supply signal (VDD). The comparison circuit (120) produces a resulting reference signal (Vbb) in response to the first reference signal (Vb1) and the second reference signal (Vb2). The detector circuit (130) produces an output signal (OUT) and an enabled signal (En) in response to the resulting reference signal (Vbb). The adjustment circuit (140) receives the first reference signal (Vb1), the resulting reference signal (Vbb), the enabled signal (En) and the optional selection signal (Sel).

The resulting reference signal (Vbb) is produced by the comparison circuit (120) in response to the two reference signals (Vb1, Vb2). The detector circuit (130) produces the output signal (OUT) in response to the resulting reference signal (Vbb) when the resulting reference signal crosses a detection level. Initially, the potential of the resulting reference signal (Vbb) tracks the potential of the power supply signal (VDD). When the power supply signal (VDD) increases past a first threshold potential, the resulting reference signal (Vbb) decreases toward a ground potential (GND). The detector circuit (130) produces a rising edge in the output signal (OUT) when the resulting reference signal decreases past the detection level. The rising edge in the output signal (OUT) may be used as a power-on reset signal.

When the power supply signal (VDD) decreases below a second threshold potential, indicating that the power supply signal is below its operating potential, the potential of the resulting reference signal (Vbb) increases above the threshold of the detection level. The detector circuit (130) produces a falling edge in the output signal (OUT) in response to the increased potential of the resulting reference signal (Vbb). The falling edge of the output signal (OUT) may be used as a low voltage detection signal that detects when the power supply has decreased below its operating potential. The detector circuit (130) has an associated amount of time delay following a transition in the resulting reference signal (Vbb) such that the rising and falling edge of the output signal (OUT) are delayed in time with respect to transitions in the resulting reference signal.

The adjustment circuit (140) adjusts the second threshold potential. The detector circuit (130) produces an enable signal (En) in response to the resulting reference signal (Vbb). The adjustment circuit (140) is enabled by the enable signal (En) after the resulting reference signal (Vbb) has decreased below the detection level. The selection signal (Sel) selects the level of adjustment performed by the adjustment circuit (140). The adjustment circuit (140) adjusts the second threshold potential in response to first reference signal (Vb1) when enabled by the enable signal (En). Although not shown, the adjustment circuit (140) may further include additional circuitry to adjust the first threshold potential. Alternatively, a second adjustment circuit may be used to dynamically adjust the first threshold potential. It is also appreciated that the adjustment circuit (140) may be configured to adjust the second threshold potential in response to a signal other than the first reference signal (Vb1), such as the second reference signal (Vb2).

The adjustment circuit (140) adjusts the falling edge of the output signal (OUT) by adjusting the second threshold potential. The falling edge corresponds to a time interval where a potential of the power supply signal (VDD) decreases below the second threshold potential. When the falling edge is adjusted, it is adjusted with respect to the power supply signal (VDD). After adjustment, the falling edge occurs at a different potential of the power supply signal (VDD). In one example, the power supply signal decreases linearly from an initial time to a subsequent time. At the subsequent time, the potential of the power supply signal crosses the second threshold potential. The time interval from the initial time to the subsequent time is adjusted by adjusting the second threshold potential. This adjustment capability of the electronic circuit (100) improves the power management by adjusting the potential of the power supply signal (VDD) at which a subsequent circuit is reset.

Figure 2:
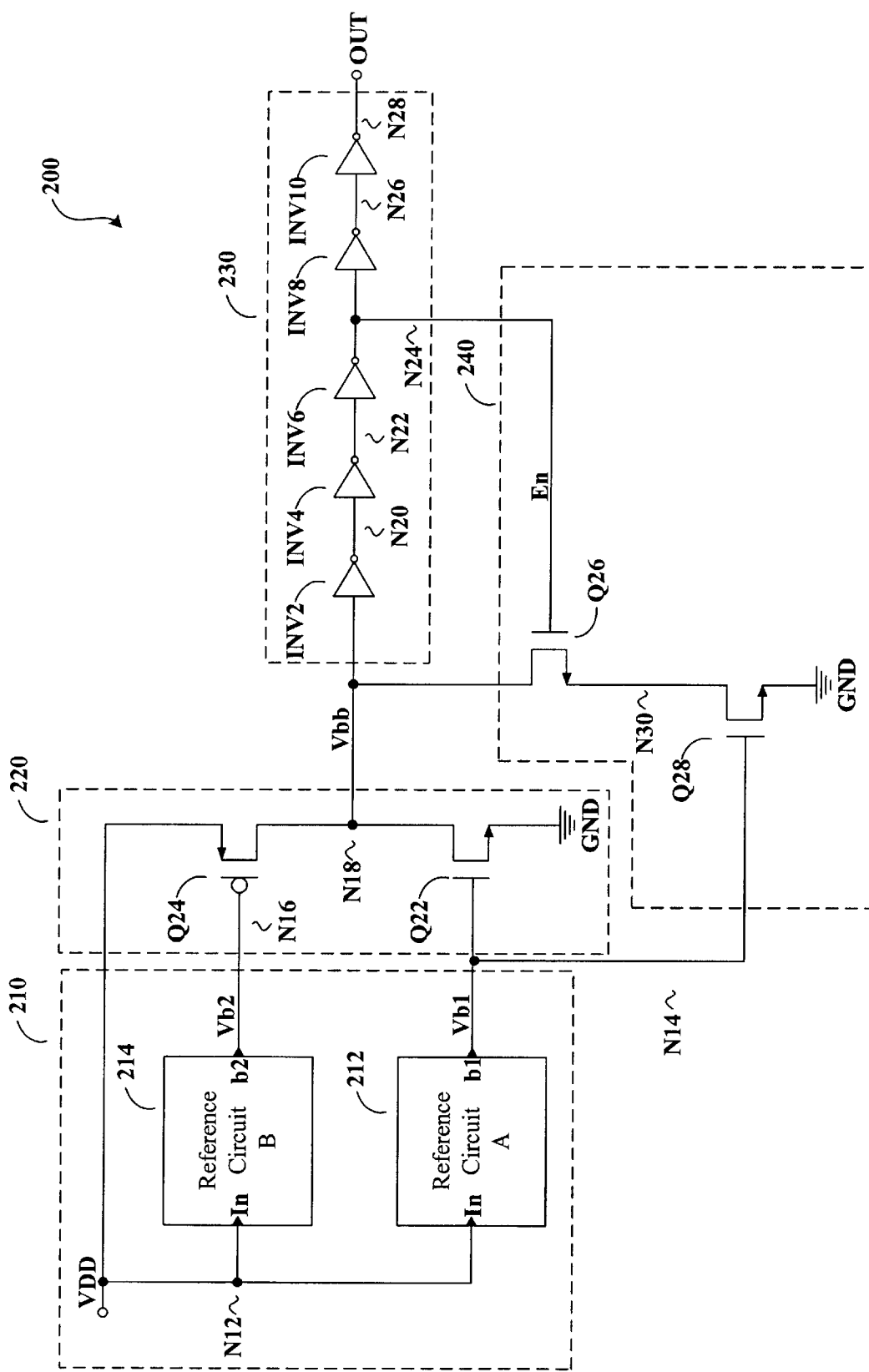
FIG. 2 shows another schematic diagram of an electronic circuit operating as a power-on reset circuit with improved power management.

FIG. 2 shows another schematic diagram of an electronic circuit (200) that is in accordance with one embodiment of the present invention. The electronic circuit includes a reference generator circuit (210), a comparison circuit (220), a detector circuit (230), and an adjustment circuit (240). The reference generator circuit (210) includes a reference circuit A (212) and a reference circuit B (214). The comparison circuit (220) includes an NMOS transistor (Q22) and a PMOS transistor (Q24). The detector circuit (230) includes five inverter circuits (INV2, INV4, INV6, INV8, INV10). The adjustment circuit (240) includes two NMOS transistors (Q26, Q28).

The reference circuit A (212) has an input port (In) that is coupled to node N12 and an output port (b1) that is coupled to node N14. The reference circuit B (214) has an input port (In) that is coupled to node N12 and an output port (b2) that is coupled to node N16. NMOS transistor Q22 has a gate that is coupled to node N14, a source that is coupled to ground (GND), and a drain that is coupled to node N18. PMOS transistor Q24 has a gate that is coupled to node N16, a source that is coupled to node N12, and a drain that is coupled to node N18. Inverter circuit INV2 is coupled between node N18 and node N20. Inverter circuit INV4 is coupled between node N20 and node N22. Inverter circuit INV6 is coupled between node N22 and node N24. Inverter circuit INV8 is coupled between node N24 and node N26. Inverter circuit INV10 is coupled between node N26 and node N28. NMOS transistor Q26 has a gate that is coupled to node N24, a source that is coupled to node N30, and a drain that is coupled to node N18. NMOS transistors Q28 has a drain that is couple to node N30, a source that is coupled to ground (GND), and a gate that is coupled to node N14.

During operation, a power supply signal (VDD) is coupled to node N12. Reference circuit A (212) and reference circuit B (214) produce reference signals Vb1 and Vb2 respectively. In the embodiment shown in FIG. 2, the first reference signal (Vb1) is associated with the potential at node N14, and the second reference signal (Vb2) is associated with the potential at node N16. The potentials at the two nodes (N14, N16) are related to the power supply signal (VDD). In the embodiment shown in FIG. 2, the potentials at nodes N14 and N16 are not equal when the power supply signal (VDD) reaches its operating potential. Instead, the potential at node N12 is lower than the potential at node N16 when the power supply signal (VDD) reaches its operating potential. It is appreciated however, that another relationship between the reference signals (Vb1, Vb2) may be used.

The reference signals (Vb1, Vb2) change with changes in the power supply signal (VDD). As the power supply signal (VDD) increases, the reference signals (Vb1, Vb2) increase. As the power supply signal (VDD) decreases, the reference signals (Vb1, Vb2) decrease. The reference signals (Vb1, Vb2) generate a resulting reference signal (Vbb) at node N18.

As the power supply signal (VDD) increases from ground (GND), 25 PMOS transistor Q24 is initially biased active (VDD−Vb2>|$V_{TQ24}$|, where $V_{TQ24}$ is the threshold potential of transistor Q24), and NMOS transistor Q22 is initially biased inactive (VDD−Vb1<|$V_{TQ22}$|, where $V_{TQ22}$ is the threshold potential of transistor Q22). Thus, PMOS transistor Q24 initially couples node N18 to the power supply signal (VDD) and the resulting reference signal (Vbb) initially increases as the power supply signal (VDD) increases. As the power supply signal (VDD) continues to increases, NMOS transistor Q22 becomes active (VDD−Vb1>|$V_{TQ22}$|) and the current gain of NMOS transistor Q22 begins to increase in comparison to the current gain of PMOS transistor Q24. Also, as the power supply signal (VDD) increases, Vb2 increases, and the current gain of PMOS transistor Q24 decreases. When the power supply signal (VDD), reaches a voltage trip point, NMOS transistor Q22 becomes dominant and sinks more current than PMOS transistor Q24 can source. The dominance of NMOS transistor Q22 results in Q22 pulling the potential at node N18 down, causing the resulting reference signal (Vbb) to drop to ground (GND).

Once the resulting reference signal (Vbb) has decreased below a detection level corresponding to inverter circuit INV2, the output of inverter circuit INV2, corresponding to the potential at node N20, transitions from a low logic level (logic "0") to a high logic level (logic "1"). The output of inverter circuit INV4 transitions from a high logic level to a low logic level in response to the potential at node N20 reaching a high logic level. The output of inverter circuit INV4, corresponding to the potential at node N22, is initially at a high logic level when the power supply signal (VDD) is increasing from ground (GND). The output of inverter circuit INV6 transitions from a low logic level to a high logic level in response to the potential at node N22 reaching a low logic level. The potential at node N24 transitions from a low logic level to a high logic level in response to inverter circuit INV6. The output of inverter circuit INV8 transitions from a high logic level to a low logic level in response to the potential at node N24 reaching a high logic level. The potential at node N26 transitions from a high logic level to a low logic level in response to inverter circuit INV8. The output of inverter circuit INV10 transitions from a low logic level to a high logic level in response to the potential at node N26 reaching a low logic level. The potential at node N28 transitions from a low logic level to a high logic level in response to inverter circuit INV10. The resulting output signal (OUT) at node N28 has a rising edge at a trip point that is delayed by the operation of the inverter circuits (INV2, INV4, INV6, INV8, INV10) when the resulting reference signal (Vbb) transitions from a high logic level to a low logic level.

NMOS transistor Q26 is activated by the transition of the potential at node N24, corresponding to an enable signal (En), from a low logic level to a high logic level. NMOS transistor Q26 assists NMOS transistor Q22 by increasing the current pulling down the potential at node N18 by providing another current path for node N18 to ground (GND).

NMOS transistors Q28 completes the connection between node N18 and ground (GND). Furthermore, NMOS transistors Q28 assists in delaying the falling edge trip point of the output signal (OUT) as the power supply signal (VDD) decreases. NMOS transistor Q28 effectively increases the channel width of NMOS transistor Q22. The increase in effective channel width changes the effective threshold potential of NMOS transistor Q22, increasing or decreasing the trip point of the falling edge of the output signal (OUT). It is appreciated that NMOS transistors Q28 may be adjustable in size. By adjusting NMOS transistor Q28, the trip point of the falling edge of the output signal (OUT) may be adjusted by changing the threshold potential established by the combination of NMOS transistor Q22, Q26, and Q28.

When the power supply signal (VDD) begins to decrease, the pull-down by NMOS transistor Q22 weakens. However, NMOS transistor Q26 and NMOS transistors Q28 continue to pull down the potential at node N18. The potential at node N18 transitions to a high logic level when the current gain of PMOS transistor Q24 increases higher than the current gain of the combination of NMOS transistors Q22, Q26, and Q28. The transition to a high logic level at node N18 causes the potential at node N24 to transition from a high logic level to a low logic level. When the potential at node N24 transitions to a low logic level, NMOS transistor Q26 is deactivated, disabling NMOS transistor Q26 and NMOS transistor Q28, from continuing to sink current from node N18. The resulting output signal (OUT) has falling edge at a trip point that is delayed by the operation of the inverter circuits (INV2, INV4, INV6, INV8, INV10), and the delay in deactivating NMOS transistor Q26. It can be appreciated that the channel length of NMOS transistor Q26 can be increased to provide further stability by increasing the delay.

Figure 3:
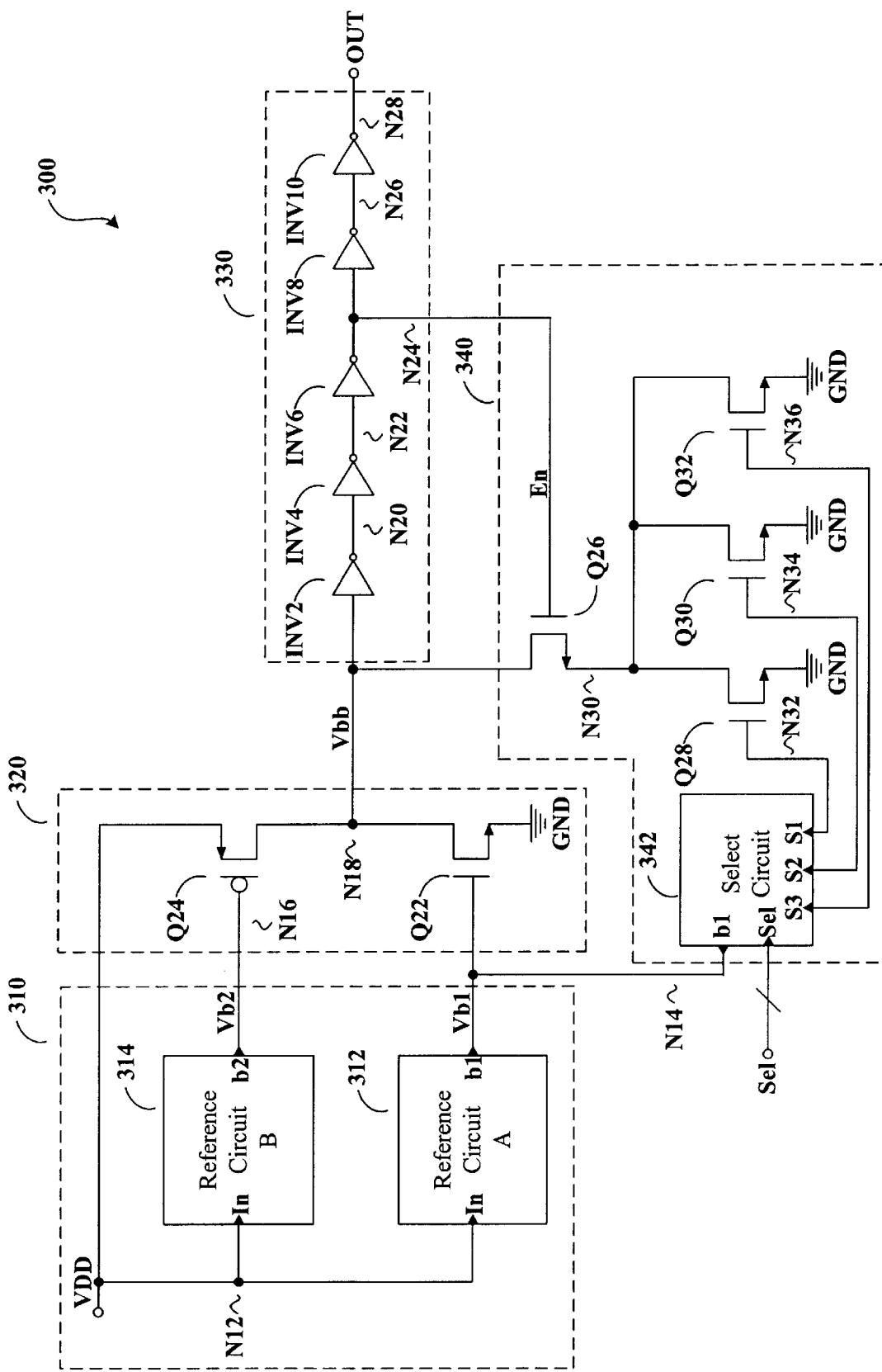
FIG. 3 illustrates another schematic diagram of an electronic circuit operating as a power-on reset circuit with improved power management.

FIG. 3 shows another schematic diagram of an electronic circuit (300) that is in accordance with one embodiment of the present invention. The electronic circuit includes a reference generator circuit (310), a comparison circuit (320), a detector circuit (330), and an adjustment circuit (340). The reference generator circuit (310) includes a reference circuit A (312) and a reference circuit B (314). The comparison circuit (320) includes an NMOS transistor (Q22) and a PMOS transistor (Q24). The detector circuit (330) includes five inverter circuits (INV2, INV4, INV6, INV8, INV10). The adjustment circuit (340) includes four NMOS transistors (Q26, Q28, Q30, Q32) and a select circuit (342).

The reference circuit A (312) has an input port (In) that is coupled to node N12 and an output port (b1) that is coupled to node N14. The reference circuit B (312) has an input port (In) that is coupled to node N12 and an output port (b2) that is coupled to node N16. NMOS transistor Q22 has a gate that is coupled to node N14, a source that is coupled to ground (GND), and a drain that is coupled to node N18. PMOS transistor Q24 has a gate that is coupled to node N16, a source that is coupled to a power supply signal (VDD), and a drain that is coupled to node N18. Inverter circuit INV2 is coupled between node N18 and node N20. Inverter circuit INV4 is coupled between node N20 and node N22. Inverter circuit INV6 is coupled between node N22 and node N24. Inverter circuit INV8 is coupled between node N24 and node N26. Inverter circuit INV10 is coupled between node N26 and node N28. NMOS transistor Q26 has a gate that is coupled to node N24, a source that is coupled to node N30, and a drain that is coupled to node N18. NMOS transistors Q28, Q30, and Q32 each have a drain that is couple to node N30, a source that is coupled to ground (GND), and a gate that is coupled to nodes N32, N34, and N36 respectively. The select circuit (342) has three input ports (S1–S3) that are coupled to nodes N32, N34, and N36 respectively, an input port (Sel) that is coupled to a select signal (Sel), and another input port (b1) that is coupled to node N14.

The electronic circuit (300) illustrated in FIG. 3 operates similarly to the electronic circuit (200) shown in FIG. 2. The adjustment circuit (240) has been replaced by a new adjustment circuit (340) that includes additional functionality in the form of select circuit (342) and additional NMOS transistors Q30 and Q32.

In adjustment circuit 340, NMOS transistor Q26 is activated when the potential at node N24 transitions from a low logic level to a high logic level. NMOS transistor Q26 assists NMOS transistor Q22 by increasing the current pulling down the potential at node N18 by providing an additional current path for node N18 to ground (GND). The additional current path is provided by selectively activating at least one of NMOS transistors Q28, Q30, and Q32 with the select circuit (342).

A select signal (Sel) selects at least one of the NMOS transistors (Q28, Q30, Q32). The gate of a selected NMOS transistor (e.g., Q28) is coupled to node N14. The other non-selected NMOS transistors (e.g., Q30, Q32) are may have their gate terminals coupled to ground (GND) to ensure that they do not activate. The selected NMOS transistor (e.g., Q28) is operated in parallel with NMOS transistor Q22, providing an additional conduction path from node N18 to ground (GND). This operation is analogous to an effective increase in the channel width of NMOS transistor Q22. The increase in the effective channel width changes the potential of the power supply signal (VDD) where PMOS transistor Q24 and NMOS transistors Q22/Q28 (when Q28 is selected) are in equilibrium (i.e. the second threshold potential). Thus, the additional transistors (i.e. Q28, Q30, Q32) are selected to increase or decrease the trip point of the falling edge of the output signal (OUT).

When the power supply signal (VDD) begins to decrease, reference signal Vb1 decreases causing the pull-down by NMOS transistor Q22 to weaken. However, NMOS transistor Q26 and NMOS transistors Q28, Q30, and Q32 (those selected) are arranged in parallel pulling down the potential at node N18. The potential at node N18 transitions to a high logic level when Vb2 decreases such that the current gain of PMOS transistor Q24 increases higher than the current gain of the combination of NMOS transistors Q22, Q26, and NMOS transistors Q28, Q30, Q32 (those selected). The transition to a high logic level at node N18 results in the potential at node N24 transitioning from a high logic level to a low logic level. When the potential at node N24 transitions to a low logic level, NMOS transistor Q26 is deactivated, disabling NMOS transistor Q26 and NMOS transistors Q28, Q30, and Q32 (those selected) from continuing to sink current from node N18. It can be appreciated that the channel length of NMOS transistor Q26 can be increased to provide further stability by increasing the pull-down on the potential at node N18.

As stated previously, the falling edge of the output signal (OUT) is determined by the parallel combination of NMOS transistor Q22 and the selected transistors of NMOS transistors Q28, Q30, and Q32. The time delay between the beginning of the power supply signal (VDD) dropout and the occurrence of the falling edge of the output signal (OUT) can be adjusted by the selection of one or more of NMOS transistors Q28, Q30, and Q32. The occurrence of the falling edge is further delayed by the operation of the inverter circuits (INV2, INV4, INV6, INV8, INV10). NMOS transistors Q28, Q30, and Q32 may have different channel widths. The trip point of the falling edge of the output signal (OUT) may be adjusted to various levels by selecting one or more of NMOS transistors Q28, Q30, and Q32.

Figure 4:
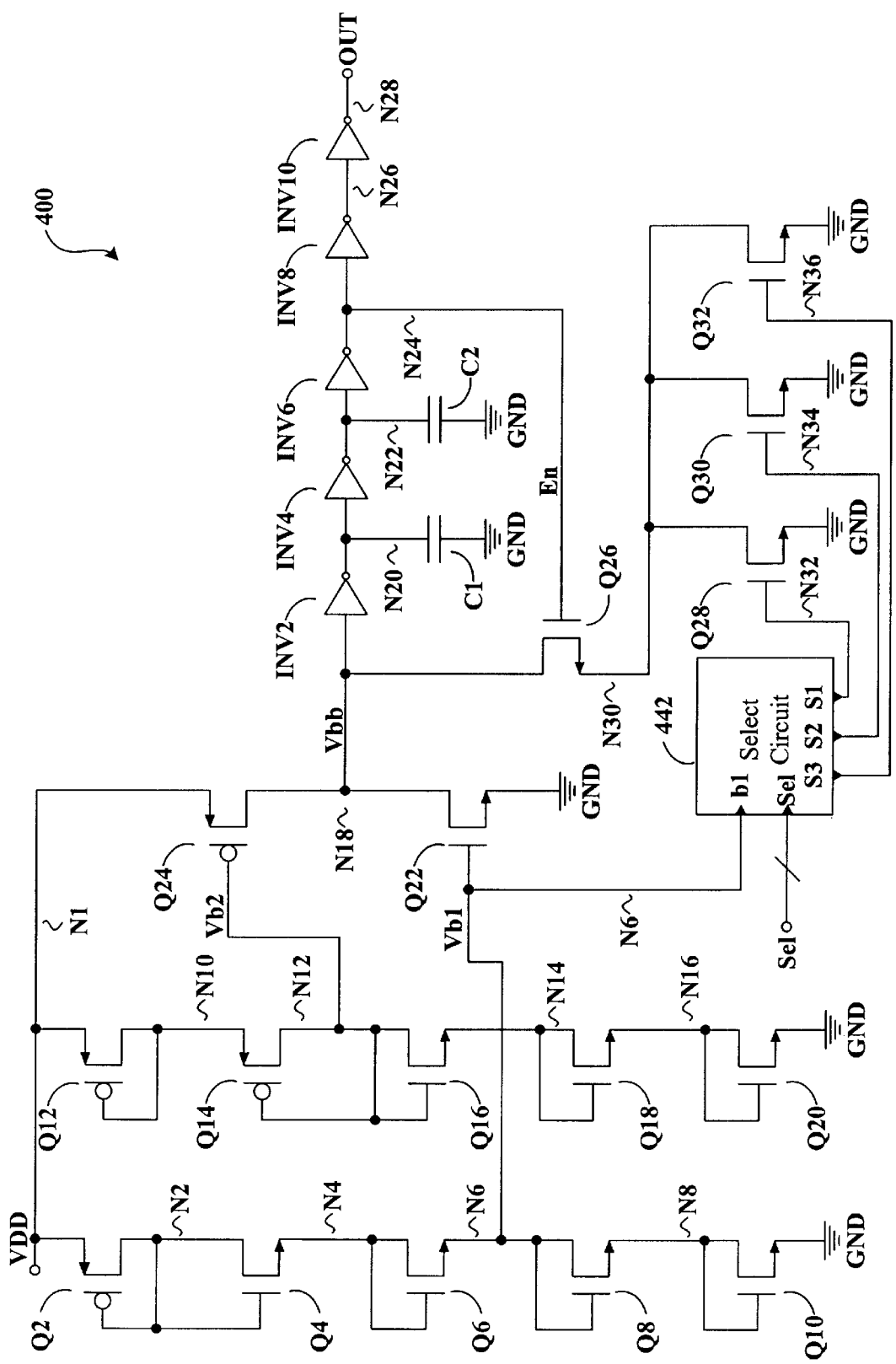
FIG. 4 shows another schematic diagram of an electronic circuit operating as a power-on reset circuit with improved power management.

FIG. 4 illustrates another schematic diagram of an electronic circuit (400) that is in accordance with one embodiment of the present invention. The electronic circuit (400) includes four PMOS transistors (Q2, Q12, Q14, Q24), twelve NMOS transistors (Q4, Q6, Q8, Q10, Q16, Q18, Q20, Q22, Q26, Q28, Q30, Q32), five inverter circuits (INV2, INV4, INV6, INV8, INV10), two capacitive circuits (C1, C2), and a select circuit (442).

Transistors Q2, Q4, Q6, Q8, Q10, Q12, Q14, Q16, Q18, and Q20 are diode connected. PMOS transistor Q2 has a source that is coupled a power supply signal (VDD), and a gate and drain that are coupled to node N2. NMOS transistor Q4 has a source that is coupled to node N4, and a gate and drain that are coupled to node N2. NMOS transistor Q6 has a source that is coupled to node N6, and a gate and drain that are coupled to node N4. NMOS transistor Q8 has a source that is coupled to node N8, and a gate and drain that are coupled to node N6. NMOS transistor Q10 has a source that is coupled to ground (GND), and a gate and drain that are coupled to node N8. PMOS transistor Q12 has a source that is coupled a power supply signal (VDD), and a gate and drain that are coupled to node N10. PMOS transistor Q14 has a source that is coupled to node N10, and a gate and drain that are coupled to node N12. NMOS transistor Q16 has a source that is coupled to node N14, and a gate and drain that are coupled to node N12. NMOS transistor Q18 has a source that is coupled to node N16, and a gate and drain that are coupled to node N14. NMOS transistor Q20 has a source that is coupled to ground (GND), and a gate and drain that are coupled to node N16. NMOS transistor Q22 has a gate that is coupled to node N6, a source that is coupled to ground (GND), and a drain that is coupled to node N18. PMOS transistor Q24 has a gate that is coupled to node N12, a source that is coupled to the power supply signal (VDD), and a drain that is coupled to node N18. Inverter circuit INV2 is coupled between node N18 and node N20. Inverter circuit INV4 is coupled between node N20 and node N22. Inverter circuit INV6 is coupled between node N22 and node N24. Inverter circuit INV8 is coupled between node N24 and node N26. Inverter circuit INV10 is coupled between node N26 and node N28. NMOS transistor Q26 has a gate that is coupled to node N24, a source that is coupled to node N30, and a drain that is coupled to node N18. NMOS transistors Q28, Q30, and Q32 each have a drain that is couple to node N30, a source that is coupled to ground (GND), and a gate that is coupled to nodes N32, N34, and N36 respectively. The select circuit (442) has three output ports (S1–S3) that are coupled to nodes N32, N34, and N36 respectively, an input port (Sel) that is coupled to a select signal (Sel), and another input port (b1) that is coupled to node N6. Capacitive circuit C1 is coupled between node N20 and ground (GND). Capacitive circuit C2 is coupled between node N22 and ground (GND).

The electronic circuit (400) illustrated in FIG. 4 operates similarly to the electronic circuit (300) shown in FIG. 3. The reference generator circuit (310) and the detector circuit (330) in FIG. 3 are illustrated in greater detail in FIG. 4.

The diode-connected transistors (Q2, Q4, Q6, Q8, Q10, Q12, Q14, Q16, Q18, Q20) are configured as two reference banks for producing two reference signals (Vb1, Vb2). In the embodiment shown in FIG. 4, the first reference signal (Vb1) is associated with the potential at node N6, and the second reference signal (Vb2) is associated with the potential at node N12. The potentials at the two nodes (N6, N12) are related to the power supply signal (VDD). The potential at node N6 corresponds to the power supply signal (VDD) minus the sum of the potential drops across the Vgs junctions of PMOS transistor Q2, and NMOS transistors Q4 and Q6. The potential at node N12 corresponds to the power supply signal (VDD) minus the sum of the potential drops across the Vgs junctions of PMOS transistors Q12 and Q14. In the embodiment shown in FIG. 4, the potentials at nodes N6 and N12 are not equal when the power supply signal (VDD) reaches its operating potential. Instead, the potential at node N6 is lower than the potential at node N12 when the power supply signal (VDD) reaches its operating potential.

Once the resulting reference signal (Vbb) has decreased below a detection level corresponding to inverter circuit INV2, the output of inverter circuit INV2 transitions from a low logic level (logic "0") to a high logic level (logic "1"). The high logic level at the output of inverter circuit INV2, causes the inverter circuit (INV2) to drive current into capacitive circuit C1, charging capacitive circuit C1. The capacitive circuit (C2) continues to charge until the potential at node N20 reaches a high logic level. Inverter circuit INV2 and capacitive circuit C1 operate as a charge circuit that is selected to charge when the resulting bias signal (Vbb) is below a threshold potential associated with inverter circuit INV2. Similarly, inverter INV2 and capacitive circuit C1 operate as a discharge circuit that is selected to discharge when the resulting bias signal (Vbb) is above a threshold potential associated with inverter circuit INV2. The charging of capacitive circuit C1 has an associated transient time based upon the current drive capability of the inverter circuit (INV2) and the size of the capacitive circuit (C1). The transient time provides a delay between the transition of the resulting bias signal (Vbb) and the transition of the potential at node N20. This delay improves stability since a momentary drop in the power supply signal (VDD) will provide insufficient time for capacitor C1 to charge sufficient to trip inverter circuit INV4.

The output of inverter circuit INV4 transitions from a high logic level to a low logic level in response to the potential at node N20 reaching a high logic level. Since the output of inverter circuit INV4 is initially at a high logic level when the power supply signal (VDD) is increasing from ground (GND), the capacitive circuit (C2) is initially charged. When the output of inverter circuit INV4 begins to transition from high to low, capacitive circuit C2 prevents the potential at node N22 from transitioning instantaneously. Capacitive circuit C2 is slowly discharged to ground (GND) limited by inverter circuit INV4 such that further delay is introduced into the electronic circuit (400). Inverter circuit INV4 and capacitive circuit C2 operate similarly to inverter circuit INV2 and capacitive circuit C1 as selectable charge and discharge circuits with an input at node N20. The output of inverter circuit INV6 transitions from a low logic level to a high logic level in response to the potential at node N22 reaching a low logic level. The potential at node N24 transitions from a low logic level to a high logic level in response to inverter circuit INV6. The output of inverter circuit INV8 transitions from a high logic level to a low logic level in response to the potential at node N24 reaching a high logic level. The potential at node N26 transitions from a high logic level to a low logic level in response to inverter circuit INV8. The output of inverter circuit INV10 transitions from a low logic level to a high logic level in response to the potential at node N26 reaching a low logic level. The potential at node N28 transitions from a low logic level to a high logic level in response to inverter circuit INV10. The resulting output signal (OUT) has a rising edge at a trip point that is delayed by the operation of the inverter circuits (INV2, INV4, INV6, INV8, INV10) and the charge times of the capacitive circuits (C1, C2) when the resulting reference signal (Vbb) transitions from a high logic level to a low logic level. It is appreciated that a timing indicator in the output signal (OUT) other than a rising edge can be produced when the potential at node N18 transition from a high logic level to a low logic level.

In light of the previous discussion, it is understood and appreciated, that Schmitt triggers may be used for one or more of the inverter circuits (INV2, INV4, INV6, INV8, INV10) to reduce oscillations in the resulting reference signal (Vbb) and the output signal (OUT), as well as the effect of noise on the electronic circuits (200, 300, 400). It is also appreciated that the capacitive circuits (C1, C2) shown in FIG. 4 can be replaced by other charge storing or delay circuits capable of delaying the transitions of the inverter circuits (INV2, INV4, INV6, INV8, INV10) such that the stability of the electronic circuit 400 is improved. NMOS transistor Q26 in FIGS. 2–4 may be replaced by another switch circuit that is actuated by the enable signal (En). In addition, NMOS transistors Q28, Q30, and Q32 may be replaced with switches (e.g., switch circuits) that have a resistive circuit coupled between each switch and ground (GND), and are actuated according to the select signal (Sel). In addition, the MOS transistors illustrated in FIGS. 2–4 may be replaced by BJT transistors, JFET transistors, GaAsFET transistors, as well as other types of transistors.

Although transistors Q28, Q30, and Q32 are shown as activated by a select circuit (342, 442) in FIGS. 3 and 4, the select circuit (342, 442) may be replaced by a hard wired connection between one or more of the gate terminals and node N14 shown in FIG. 3 and node N6 shown in FIG. 4 (e.g., a metal mask selection circuit). The hard-wired connection can be implemented as a simple mask change in an integrated circuit. Alternatively, a set of fuse links (e.g., a fuse link circuit) may be employed to selectively break the connections as is understood by one of ordinary skill in the art. The select circuits (342, 442) in FIGS. 3 and 4 operate as multiplexers, selectively coupling the bias signal (Vb1) to the gates of the transistors Q28, Q30, and Q32.

Figure 5:
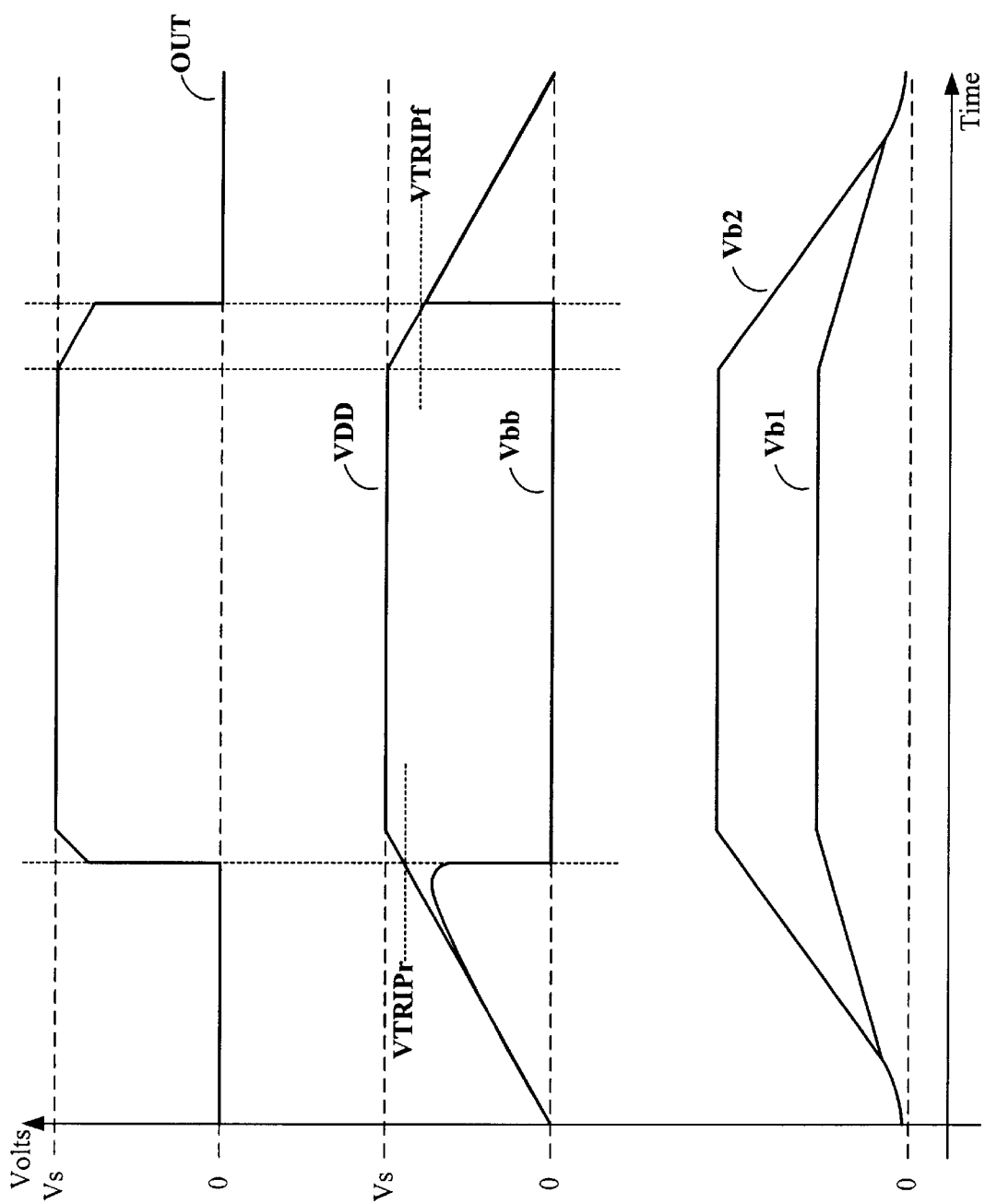
FIG. 5 illustrates a graph of the waveforms associated with the electronic circuit shown in FIG. 4 in accordance with the invention.

FIG. 5 illustrates a graph of the waveforms associated with the electronic circuit shown in FIG. 4. The power supply signal (VDD) is a voltage that is in a range of 0V to the operating voltage (Vs). The maximum potential of the output signal (OUT) is limited by the potential of the power supply signal (VDD). The limiting effect is illustrated by the output signal (OUT) tracking the power supply signal (VDD) after the rising edge of the output signal (OUT) has occurred. The output signal (OUT) continues to track the power supply signal (VDD) until the falling edge of the output signal (OUT) occurs. The timing of the rising and falling edges of the output signal (OUT) depend upon when their associated trip points (VTRIPr, VTRIPf) occur. As previously mentioned, while the power supply signal (VDD) increases in value, the resulting bias signal (Vbb) tracks the power supply signal (VDD). The resulting bias signal (Vbb) continues to track the power supply signal (VDD) until the rising edge trip point (VTRIPr) is reached by the power supply signal (VDD). The rising edge trip point (VTRIPr) is related to the threshold potentials of NMOS transistor Q22 and PMOS transistor Q24 previously described. The resulting bias signal (Vbb) resumes tracking the power supply signal (VDD) when the falling edge trip point (VTRIPf) is reached by the power supply signal (VDD). The falling edge trip point (VTRIPf) is related to the threshold potentials of the NMOS transistors Q22, Q26, and the selected transistors of NMOS transistors Q28, Q30, and Q32 shown in FIG. 4. Depending on which combination of NMOS transistors Q28, Q30, and Q32 is selected, the falling edge trip point (VTRIPf) may be adjusted. As mentioned previously, NMOS transistors Q28, Q30, and Q32 have different channel widths, which contribute differently to a delay of the falling edge trip point (VTRIPf). Adjusting the falling edge trip point (VTRIPf) effectively adjusts the occurrence in time of the falling edge of the output signal (OUT).

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus for generating a power-on reset signal, wherein the power-on reset signal has a rising edge and an adjustable falling edge, comprising:

a reference generator circuit that is arranged to produce a first reference signal and a second reference signal in response a power supply signal, a comparison circuit that is arranged to produce a resulting reference signal in response to a comparison between the first reference signal and the second reference signal, wherein the resulting reference signal depends upon a first threshold potential and a second threshold potential of the power supply signal;

a detector circuit that is arranged to produce the power-on reset signal in response to the resulting reference signal such that the rising edge occurs in the power-on reset signal when the power supply signal increases above the first threshold potential and the adjustable falling edge occurs when the power supply signal decreases below the second threshold potential; and an adjustment circuit that is arranged to adjust the adjustable falling edge of the power-on reset signal in response to the resulting reference signal.

2. The apparatus of claim 1, wherein the detector circuit further comprises a delay circuit that is arranged to delay a transition in the power-on reset signal whereby the stability of the power-on reset signal is improved.

3. The apparatus of claim 2, wherein the delay circuit further comprises an inverter circuit that is coupled to a capacitive circuit such that the delay in the transition in the power-on reset signal is determined by a current drive capability of the inverter circuit in conjunction with a capacitance value associated with the capacitive circuit.

4. The apparatus of claim 2, wherein the delay circuit is at least one of a selectable discharge circuit and a selectable charge circuit.

5. The apparatus of claim 1, wherein the resulting reference signal transitions to a logic low level when the power supply signal increases beyond the first threshold potential and the resulting reference signal transitions to a high logic level when the power supply signal decreases below the second threshold potential.

6. The apparatus of claim 1, wherein the power supply signal decreases from an initial time to a subsequent time, the subsequent time corresponding to the second threshold potential such that a time interval from the initial time to the subsequent time is adjusted the second threshold potential.

7. The apparatus of claim 1, wherein the adjustment circuit is enabled when the power supply signal is at an operating potential and the adjustment circuit adjusts the falling edge of the power-on reset signal according to a predetermined level, wherein the falling edge occurs when the power supply signal decreases below the operating potential by a sufficient amount.

8. The apparatus of claim 1, the adjustment circuit further comprising a transistor biased by the first reference signal that is selectively coupled to a node associated with the resulting reference signal such that the adjustable falling edge of the power-on reset signal is changed with respect to the power supply signal.

9. The apparatus of claim 1, the adjustment circuit further comprising parallel coupled switch circuits that are selectively coupled to a node associated with the resulting reference signal when actuated, each parallel coupled switch circuit having an associated resistance when actuated, wherein the parallel coupled switch circuits are actuated by a select circuit such that the adjustable falling edge of the power-on reset signal is adjusted to different levels with respect to the power supply signal.

10. The apparatus of claim 9, wherein the select circuit includes a fuse link circuit that is arranged to selectively disable at least one of the parallel coupled switch circuits.

11. The apparatus of claim 9, wherein the select circuit includes a metal mask selection circuit that is arranged to change the selection of the parallel coupled switch circuits.

12. The apparatus of claim 1, wherein the reference generator circuit further comprises a first reference circuit that is arranged to produce the first reference signal and a second reference circuit that is arranged to produce the second reference signal.

13. The apparatus of claim 1, the reference generator circuit further comprising a first bank of transistors that are arranged as diodes and a second bank of transistors that are arranged as diodes, such that the potentials of the first and second reference signals correspond to a number of diode drops below the power supply signal.

14. The apparatus of claim 1, wherein the first reference signal and second reference correspond to different potentials that are below the power supply signal.

15. The apparatus of claim 1, the comparison circuit further comprising a first transistor and a second transistor wherein the rising edge of the power-on reset signal occurs when the first transistor sinks more current than the second transistor can provide such that a transition occurs in the resulting reference signal.

16. A method for producing a power-on reset signal with improved power management, comprising:

generating a first reference signal that relates to a power supply signal;

generating a second reference signal that relates to the power supply signal;

comparing the first reference signal to the second reference signal;

producing a resulting reference signal with an associated potential at a node in response to the comparison of the first reference signal to the second reference signal;

detecting the associated potential of the resulting reference signal;

triggering a first edge in the power-on reset signal in response to the associated potential of the resulting reference signal when the power supply signal crosses a first threshold potential;

triggering the second edge in the power-on reset signal in response to the associated potential of the resulting reference signal when the power supply signal crosses a second threshold potential, wherein the second threshold potential is different from the first threshold potential; and the second edge in the power-on reset signal in response to adjusting the second threshold potential.

17. The method in claim 16, wherein adjusting the second edge potential further comprises selectively coupling a switch circuit and a resistive circuit to the node.

18. The method in claim 16, wherein comparing the first reference signal to the second reference signal further comprises:

producing a first current with a first transistor that is coupled to the first reference signal;

producing a second current with a second transistor that is coupled to the second reference signal; and producing an edge in the power-on reset signal when the power supply signal changes such that the current of one of the first and second transistors becomes dominant over the current of the other one of the first and second transistors in response to the change in the power supply signal.

19. The method in claim 16, wherein detecting the associated potential of the resulting reference signal further comprises delaying the occurrence of the rising edge and the falling edge of the power-on reset signal with respect to the first and second transition by the power supply signal.

20. The method in claim 16, wherein the first reference signal is different from the second reference signal.

21. An apparatus for providing a power-on reset signal with an adjustable second edge, comprising:

a means for generating a first reference signal is arranged to generate a first reference signal that relates to a power supply signal;

a means for generating a second reference signal is arranged to generate a second reference signal that relates to the power supply signal;

a means for producing a resulting reference signal is arranged to produce a resulting reference signal with an associated potential in response to the first reference signal and the second reference signal;

a means for detecting is arranged to detect the associated potential of the resulting reference signal;

a means for triggering a first edge is arranged to trigger a first edge in the power-on reset signal in response to the associated potential of the resulting reference signal when the power supply signal crosses a first threshold potential;

a means for triggering the second edge is arranged to trigger a second edge in the power-on reset signal in response to the associated potential of the resulting reference signal when the power supply signal crosses a second threshold potential, wherein the second threshold potential is different from the first threshold potential; and a means for adjusting is arranged to adjust the second edge in the power-on reset signal in response to the second threshold potential.

22. The apparatus in claim 21, wherein the adjustment means is enabled when the power supply signal reaches an operating potential such that the power supply signal exceeds the first threshold potential, and when the power supply signal decreases below the operating potential, the adjustment circuit adjusts the second edge of the power-on reset signal according to a predetermined level.

23. The apparatus in claim 21, the detecting means further comprising a delay means that is arranged to provide a delay between a transition in the resulting reference signal and a corresponding transition in the power-on reset signal.

24. The apparatus in claim 23, the delay means further comprising an inverter circuit that is coupled to a capacitive circuit such that the delay is associated with a current drive capability of the inverter circuit and a capacitance value associated with the capacitive circuit.

* * * * *

UNITED STATES PATENT AND TRADEMARK OFFICE
CERTIFICATE OF CORRECTION

PATENT NO.   : 6,515,523 B1
DATED        : February 4, 2003
INVENTOR(S)  : Simon Bikulcius It is certified that error appears in the above-identified patent and that said Letters Patent is hereby corrected as shown below:

Column 13,
Line 26, after "adjusted" add -- in response to --.

Column 14,
Line 30, before "the second" add -- adjusting --.
Line 31, delete "adjusting".
Line 33, delete "potential".

Signed and Sealed this

Ninth Day of September, 2003

JAMES E. ROGAN
*Director of the United States Patent and Trademark Office*